United States Patent [19]
Ukeda et al.

[11] Patent Number: 5,858,578
[45] Date of Patent: Jan. 12, 1999

[54] PHOTO MASKS FOR DEVELOPING PLANAR LAYERS IN A SEMICONDUCTOR DEVICE, AND METHODS OF FORMING THE SAME

[75] Inventors: Takaaki Ukeda; Tatsuya Yamada, both of Osaka; Yoshiaki Kato, Hyogo; Akio Miyajima, Osaka, all of Japan

[73] Assignee: Matsushita Electric Industrial Co., Ltd., Osaka, Japan

[21] Appl. No.: 665,622

[22] Filed: Jun. 18, 1996

[51] Int. Cl.$^6$ .................................................. G03F 9/00
[52] U.S. Cl. ....................................................... 430/5
[58] Field of Search ............................. 430/5, 311

[56] References Cited

U.S. PATENT DOCUMENTS 5,189,506  2/1993  Cronin et al. ........................... 257/752
5,418,092  5/1995  Okamoto ..................................... 430/5

*Primary Examiner*—M. Nuzzolillo
*Assistant Examiner*—Laura Weiner
*Attorney, Agent, or Firm*—McDermott, Will & Emery

[57] ABSTRACT

The semiconductor masking device of the invention includes a first semiconductor mask for forming an interconnection on a semiconductor substrate and a second semiconductor mask for forming a resist pattern on an insulating film. The first semiconductor mask has three masking areas and the second semiconductor mask has two masking areas. Masking area intervals, that is, the distances between the three masking areas of the first semiconductor mask and the two masking areas of the second semiconductor mask, are all equal to one another.

8 Claims, 13 Drawing Sheets

PHOTO MASKS FOR DEVELOPING PLANAR LAYERS IN A SEMICONDUCTOR DEVICE, AND METHODS OF FORMING THE SAME

BACKGROUND OF THE INVENTION

The present invention relates to a method of manufacturing a semiconductor device. More particularly, the invention relates to a semiconductor masking device which can completely flatten a level difference portion of an insulating film formed due to irregularity on a semiconductor substrate, a method of manufacturing the semiconductor masking device and a method of manufacturing a semiconductor device using the semiconductor masking device.

As a semiconductor device has achieved a higher density and has become more refined, a technique to flatten the surface of an insulating film has become more and more significant.

A conventional method of manufacturing a semiconductor device having a multilayer interconnection structure will now be described referring to FIGS. 13(a) through 13(e).

As is shown in FIG. 13(a), interconnections 91 are first formed on a semiconductor substrate 90 bearing semiconductor elements, and then, as is shown in FIG. 13(b), an interlayer insulating film 92 of, for example, a silicon oxide film is deposited on the semiconductor substrate 90 so as to cover the interconnections 91.

Next, as is shown in FIG. 13(c), in order to flatten the surface of the interlayer insulating film 92, a resist film 93 is formed by coating the interlayer insulating film 92 with a flattening material such as a resist.

Then, as is shown in FIG. 13(d), the resist film 93 is etched as a first etch back process. In this etch back process, an end point detector is generally used so as to stop the etching when the surface of the interlayer insulating film 92 is exposed. After this, as is shown in FIG. 13(e), a second etch back process is conducted under conditions which make the etching rate for the interlayer insulating film 92 equal to that for the resist film 93, so as to flatten the surface of the interlayer insulating film 92.

In the case where the surface of the interlayer insulating film is flattened in the aforementioned manner, however, when a distance between the adjacent interconnections 91 causing level differences underneath is several pm or more, the surface of the interlayer insulating film 92 has recesses after completing the etching because of the coating characteristic of the resist film 93. Since the etch back is a technique to transfer the flatness of the top surface of the resist film 93 to the surface of the interlayer insulating film 92 as the ultimate surface form, the surface of the interlayer insulating film 92 ultimately obtained has the recesses.

In this manner, in the conventional method of manufacturing a semiconductor device, it is impossible to decrease an absolute level difference formed on the surface of the interlayer insulating film 92.

Furthermore, as a semiconductor element has been more refined, it is also significant to secure a depth of focus in lithography. In the aforementioned conventional method of manufacturing a semiconductor device, however, since the absolute level difference formed on the surface of the interlayer insulating film cannot be decreased, the depth of focus cannot be improved. This automatically leads to a limit in the refinement of a semiconductor element.

In order to solve the aforementioned problems, it is indispensable to introduce a technique to completely flatten an interlayer insulating film, and chemical mechanical polishing has recently attracted attention as the completely flattening technique for an interlayer insulating film. However, the flattening of an interlayer insulating film by the chemical mechanical polishing has various problems as follows: (1) It is necessary to introduce new equipment; and (2) the polishing process has obvious pattern dependency and is very difficult to control.

SUMMARY OF THE INVENTION

In view of the aforementioned conventional problems, an object of the present invention is realizing complete flattening of an insulating film applicable to the refinement of elements as well as conducting etch back of a resist film while well controlling the flattening of the insulating film.

The semiconductor masking device of this invention comprises a first semiconductor mask having first masking areas for forming a first recessed or projected pattern on a semiconductor substrate; and a second semiconductor mask having second masking areas for forming a second pattern on the semiconductor substrate and an insulating film formed on the first pattern so as to fill recesses caused by the first pattern. In this semiconductor masking device, distances between outlines of the first masking areas and outlines of the second masking areas obtained by overlapping the first semiconductor mask and the second semiconductor mask are set at a predetermined uniform dimension.

In the semiconductor masking device of the invention, the distances between the outlines of the first masking areas of the first semiconductor mask and the outlines of the second masking areas of the second semiconductor mask obtained by overlapping the first semiconductor mask and the second semiconductor mask are set at a predetermined uniform dimension. Accordingly, a distance between the first pattern formed by using the first semiconductor mask and the second pattern formed by using the second semiconductor mask is fixed. As a result, a distance between the side face of a recess formed in the insulating film and the side face of the second pattern can be fixed. Thus, the recesses formed in the insulating film can be substantially completely filled with the second pattern by appropriately setting the predetermined uniform dimension.

In this manner, the recesses formed in the insulating film can be substantially completely filled with the second pattern, and hence, an absolute step difference in the insulating film can be decreased. Accordingly, the depth of focus in lithography can be improved, and additionally, the surface of the insulating film can be completely flattened by etching back the second pattern and the insulating film. Thus, the semiconductor masking device is sufficiently applicable to super-refinement of semiconductor elements, and the insulating film can be completely flattened without conducting the chemical mechanical polishing.

In the semiconductor masking device, the predetermined uniform dimension is preferably larger than the width of a sidewall formed in the insulating film so as to surround each of the recesses. In this manner, even when slight alignment shift is caused between the first semiconductor mask and the second semiconductor mask, the second pattern is prevented from being disposed on the sidewall around the recess. Thus, the flatness of the surface of the insulating film after the etch back is not affected.

The first method of manufacturing a semiconductor masking device of this invention comprises a first semiconductor mask production step of producing a first semiconductor mask having first masking areas for forming a first projected or recessed pattern on a semiconductor substrate; and a second semiconductor mask production step of producing a second semiconductor mask having second masking areas for forming a second pattern on the semiconductor substrate and an insulating film formed on the first pattern so as to fill recesses caused by the first pattern. In this method, the second semiconductor mask production step includes a first step of forming first intermediate masking areas by enlarging the first masking areas of the first semiconductor mask by a predetermined first dimension; a second step of forming second intermediate masking areas by decreasing the first intermediate masking areas by a predetermined second dimension; and a third step of reversing the second intermediate masking areas so as to produce the second semiconductor mask having the second masking areas.

In the first method of manufacturing a semiconductor masking device, when the first intermediate masking areas are formed by enlarging the first masking areas of the first semiconductor mask by the predetermined first dimension, the first masking areas with a distance therebetween smaller than the double of the predetermined first dimension are graphically combined. Therefore, an area between the first masking areas with a distance smaller than the double of the predetermined first dimension, that is, an area between the first patterns disposed closer to each other than the double of the predetermined first dimension, is ignored and is not recovered when the first intermediate masking areas are decreased so as to form the second intermediate masking areas. Accordingly, in the area between the first patterns closer to each other than the double of the predetermined first dimension, any of the second masking areas of the second semiconductor mask formed by reversing the second intermediate masking areas is not present, and hence, no second pattern is formed.

Therefore, by appropriately setting the predetermined first and second dimensions, the recesses formed in the insulating film can be substantially completely filled.

The second method of manufacturing a semiconductor masking device of this invention comprises a first semiconductor mask production step of producing a first semiconductor mask having first masking areas for forming a first projected or recessed pattern on a semiconductor substrate; and a second semiconductor mask production step of producing a second semiconductor mask having second masking areas for forming a second pattern on the semiconductor substrate and an insulating film formed on the first pattern so as to fill recesses caused by the first pattern. In this method, the second semiconductor mask production step includes a first step of forming first intermediate masking areas by enlarging the first masking areas of the first semiconductor mask by a predetermined first dimension; a second step of forming second intermediate masking areas by reversing the first intermediate masking areas; and a third step of enlarging the second intermediate masking areas by a predetermined second dimension so as to produce the second semiconductor mask having the second masking areas.

In the second method of manufacturing a semiconductor masking device, similarly to the first manufacturing method, the first masking areas of the first semiconductor mask are enlarged by the predetermined first dimension so as to form the first intermediate masking areas. Therefore, when a distance between the first masking areas is smaller than the double of the predetermined first dimension, these first masking areas are graphically combined. As a result, an area between the first masking areas with a distance therebetween smaller than the double of the predetermined first dimension, that is, an area between the first patterns disposed closer to each other than the double of the predetermined first dimension, is ignored and is not recovered by reversing the first intermediate masking areas and decreasing the reversed areas. Accordingly, in the area between the first patterns disposed closer to each other than the double of the predetermined first dimension, any of the second masking areas of the second semiconductor mask is not present, and hence, no second pattern is formed.

Accordingly, by appropriately setting the predetermined first and second dimensions, the recesses formed in the insulating film can be substantially completely filled.

The third method of manufacturing a semiconductor masking device of this invention comprises a first semiconductor mask production step of producing a first semiconductor mask having first masking areas for forming a first projected or recessed pattern on a semiconductor substrate; and a second semiconductor mask production step of producing a second semiconductor mask having second masking areas for forming a second pattern on the semiconductor substrate and an insulating film formed on the first pattern so as to fill recesses caused by the first pattern. In this method, the second semiconductor mask production step includes a first step of forming first intermediate masking areas by reversing the first masking areas of the first semiconductor mask; a second step of forming second intermediate masking areas by decreasing the first intermediate masking areas by a predetermined first dimension; and a third step of enlarging the second intermediate masking areas by a predetermined second dimension so as to produce the second semiconductor mask having the second masking areas.

In the third method of manufacturing a semiconductor masking device, after forming the first intermediate masking areas by reversing the first masking areas of the first semiconductor mask, the first intermediate masking areas are decreased by the predetermined first dimension so as to form the second intermediate masking areas. Then, the second intermediate masking areas are enlarged by the predetermined second dimension. When a distance between the first masking areas is smaller than the double of the predetermined first dimension, these first masking areas are graphically combined. Therefore, an area between the first masking areas with a distance therebetween smaller than the double of the predetermined first dimension, that is, an area between the first patterns disposed closer to each other than the double of the predetermined first dimension, is ignored. Accordingly, in the area between the first patterns closer to each other than the double of the predetermined first dimension, any of the second masking areas of the second semiconductor mask is not present, and hence, no second pattern is formed.

Accordingly, by appropriately setting the predetermined first and second dimensions, the recesses formed in the insulating film can be substantially completely filled.

In each of the first through third methods of manufacturing a semiconductor masking device, the predetermined second dimension is preferably smaller than the predetermined first dimension. In this manner, the first masking areas of the first semiconductor mask are prevented from overlapping the second masking areas of the second semiconductor mask, and hence, the second pattern can be formed on the recesses formed in the insulating film, so as to completely fill the recesses. Therefore, the surface of the insulating film can be securely flattened.

The first method of manufacturing a semiconductor device of this invention comprises a first step of preparing a semiconductor masking device including a first semiconductor mask having first masking areas and a second semiconductor mask having second masking areas, distances between outlines of the first masking areas and outlines of the second masking areas obtained by overlapping the first semiconductor mask and the second semiconductor mask being set at a predetermined uniform dimension; a second step of depositing a conductive film on a semiconductor substrate on which semiconductor elements are previously formed; a third step of forming an interconnection by etching the conductive film by using the first semiconductor mask; a fourth step of depositing an interlayer insulating film on the interconnection and the semiconductor substrate; a fifth step of depositing a first resist film on the interlayer insulating film; a sixth step of making the first resist film into a resist pattern by using the second semiconductor mask; a seventh step of depositing a second resist film on the resist pattern and the interlayer insulating film; an eighth step of etching the second resist film so as to substantially completely remove the second resist film; and a ninth step of etching the remaining second resist film, the resist pattern and the interlayer insulating film so as to remove the remaining second resist film and the resist pattern and flatten a surface of the interlayer insulating film.

In the first method of manufacturing a semiconductor device, when the first resist film deposited on the interlayer insulating film is made into the resist pattern by using the second semiconductor mask, distances between the interconnections formed by using the first semiconductor mask and the resist pattern formed by using the second semiconductor mask are made uniform. Thus, the recesses formed in the interlayer insulating film can be substantially completely filled with the resist pattern.

Therefore, when the resist pattern and the interlayer insulating film are etched back, the surface of the interlayer insulating film can be completely flattened. In this manner, it is possible to manufacture a semiconductor device with a refined pattern and high reliability at a high yield.

The first method of manufacturing a semiconductor device preferably comprises a step of forming a cured layer on the surface of the resist pattern between the sixth step and the seventh step. In this manner, the resist pattern is prevented from being mixed with the second resist film deposited on the resist pattern, and hence, the surface of the interlayer insulating film can be completely flattened after conducting the etch back.

In the first method of manufacturing a semiconductor device, the eighth step preferably includes a step of stopping etching the second resist film before the interlayer insulating film is exposed. In this manner, minor irregularity formed on the surface of the interlayer insulating film due to semiconductor elements other than the interconnections can be eliminated. Therefore, it is possible to prevent the occurrence of a problem that a super-refined pattern cannot be formed due to a lack of the depth of focus.

In the first method of manufacturing a semiconductor device, the ninth step preferably includes a step of dry etching the remaining second resist film, the resist pattern and the interlayer insulating film by using an etching gas having a mixing ratio obtained on the basis of an exposed area ratio of the second semiconductor mask. In this manner, the ratio between the etching rate for the resist pattern and that for the interlayer insulating film can be optimized, and hence, an interlayer insulating film having a flat surface can be securely formed.

In the first method of manufacturing a semiconductor device, the etching gas preferably has a mixing ratio which makes the etching rate for the resist pattern substantially equal to the etching rate for the interlayer insulating film. In this manner, the etching of the resist pattern and the etching of the interlayer insulating film are proceeded at the same rate, so that an interlayer insulating film having a completely flat surface can be securely formed.

The second method of manufacturing a semiconductor device of this invention comprises a first step of preparing a semiconductor masking device including a first semiconductor mask having first masking areas and a second semiconductor mask having second masking areas, distances between outlines of the first masking areas and outlines of the second masking areas obtained by overlapping the first semiconductor mask and the second semiconductor mask being set at a predetermined uniform dimension; a second step of etching a semiconductor substrate by using the first semiconductor mask so as to form recesses on the semiconductor substrate; a third step of depositing an insulating film on the semiconductor substrate having the recesses; a fourth step of depositing a first resist film on the insulating film; a fifth step of making the first resist film into a resist pattern by using the second semiconductor mask; a sixth step of depositing a second resist film on the resist pattern and the insulating film; a seventh step of etching the second resist film so as to substantially completely remove the second resist film; and an eighth step of etching the remaining second resist film, the resist pattern and the insulating film, so as to remove the remaining second resist film and the resist pattern, flatten a surface of the insulating film and place the surface of the insulating film at the same level as a surface of the semiconductor substrate.

In the second method of manufacturing a semiconductor device, when the first resist film deposited on the insulating film on the semiconductor substrate having the recesses is made into the resist pattern by using the second semiconductor mask, distances between the recesses formed by using the first semiconductor mask and the resist pattern formed by using the second semiconductor mask are made uniform. Therefore, the recesses formed in the insulating film can be substantially completely filled with the resist pattern.

Accordingly, when the resist pattern and the insulating film are etched back, the surface of the insulating film can be placed at the same level as the surface of the semiconductor substrate as well as can be made flat. In this manner, it is possible to manufacture a semiconductor device with a refined pattern and high reliability at a high yield.

The second method of manufacturing a semiconductor device preferably comprises a step of forming a cured layer on the surface of the resist pattern between the fifth step and the sixth step. In this manner, the resist pattern is prevented from being mixed with the second resist film deposited on the resist pattern, and hence, the surface of the insulating film can be placed at the same level as the surface of the semiconductor substrate and can be made flat after conducting the etch back.

In the second method of manufacturing a semiconductor device, the seventh step preferably includes a step of stopping etching the second resist film before the insulating film is exposed. In this manner, minor irregularity on the surface of the insulating film can be eliminated, and hence, it is possible to prevent the occurrence of a problem that a super-refined pattern cannot be formed due to a lack of the depth of focus.

In the second method of manufacturing a semiconductor device, the eighth step preferably includes a step of dry etching the remaining second resist film, the resist pattern and the insulating film by using an etching gas having a mixing ratio obtained on the basis of an exposed area ratio of the second semiconductor mask. In this manner, the ratio between the etching rate for the resist pattern and that for the insulating film can be optimized, and hence, it is possible to securely form an insulating film whose surface is placed at the same level as the surface of the semiconductor substrate and is completely flat.

In the second method of manufacturing a semiconductor device, the etching gas preferably has a mixing ratio which makes the etching rate for the resist pattern substantially equal to the etching rate for the insulating film. In this manner, the etching of the resist pattern and the etching of the insulating film are proceeded at the same rate, and hence, it is possible to securely form an insulating film whose surface is placed at the same level as the surface of the semiconductor substrate and is completely flat.

DETAILED DESCRIPTION OF THE INVENTION

A semiconductor masking device according to an embodiment of the invention will now be described referring to the accompanying drawings.

Figure 1A:
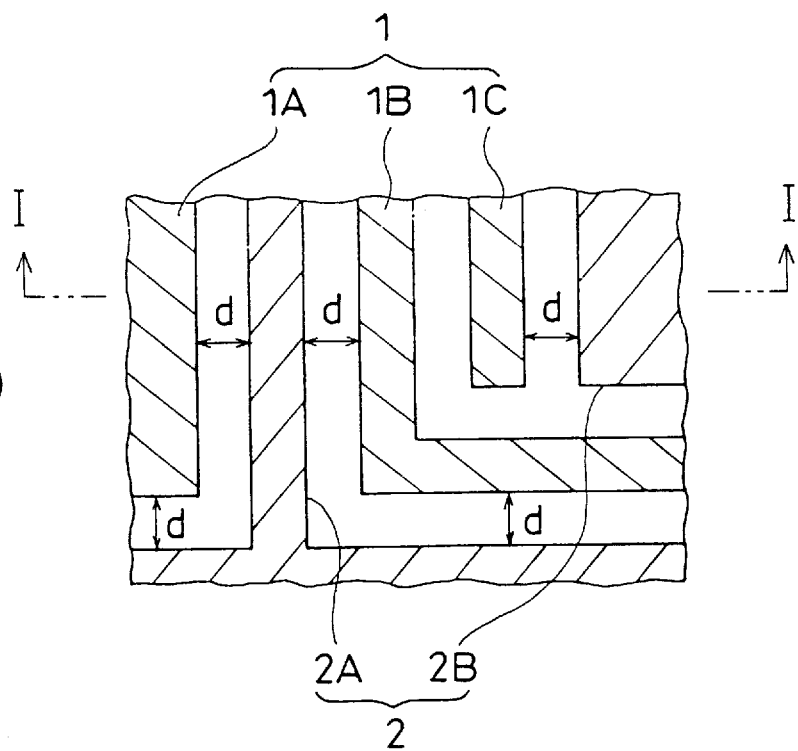
FIG. 1(a) is a plan view of a part of a semiconductor masking device according to an embodiment of the invention.

FIG. 1(a) shows the plane structure of a part of the semiconductor masking device according to the embodiment, and the semiconductor masking device comprises a first semiconductor mask 1 for masking a resist pattern area where an interconnection area or an isolation is formed, and a second semiconductor mask 2 for masking a resist pattern area formed on an insulating film. The first semiconductor mask 1 includes masking areas 1A, 1B and 1C, and the second semiconductor mask 2 includes masking areas 2A and 2B. The second semiconductor mask 2 is formed so as to make uniform masking area intervals d, which are obtained by overlapping the first semiconductor mask 1 and the second semiconductor mask 2 as distances between the masking areas 1A, 1B and 1C of the first semiconductor mask 1 and the masking areas 2A and 2B of the second semiconductor mask 2.

Figure 1B:
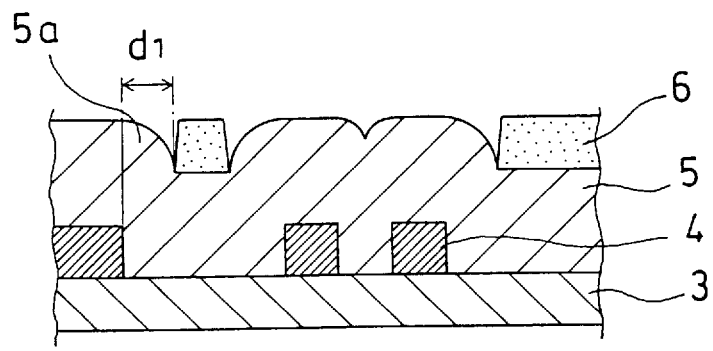
FIG. 1(b) is a sectional view showing a resist pattern formed by using the semiconductor masking device of the embodiment.

FIG. 1(b) shows a sectional view of a resist pattern 6 formed as follows: A conducive film deposited on a semiconductor substrate 3 is made into a pattern by using the first semiconductor mask 1 so as to form an interconnection 4. Then, an insulating film 5 is deposited on the entire top surface of the semiconductor substrate 3, and a resist film is deposited on the insulating film 5. The resist film is then made into the resist pattern 6 by using the second semiconductor mask 2. FIG. 1(b) corresponds to a sectional view taken along line I—I of FIG. 1(a).

In this embodiment, each masking area interval d is set to be equal to a width $d_1$ of a sidewall 5a formed in the insulating film 5. The width $d_1$ of the sidewall 5a varies depending upon the thickness of the insulating film 5, and hence, the masking area interval d is set correspondingly to the thickness of the insulating film 5.

When the masking area interval d is equal to the width d, of the sidewall 5a, the flatness of the insulating film 5 after a flattening process is most excellent, but the masking area interval d can be larger than the width $d_1$ of the sidewall 5a. This is because the flatness of the insulating film 5 can be controlled to some extent by controlling either the size of a level difference caused by the interconnection 4 in the pattern formed by using the masking areas 1A through 1C of the first semiconductor mask 1 or the viscosity of a resist material for the resist pattern 6. In contrast, when the masking area interval d is smaller than the width d, of the sidewall 5a, the flatness of the insulating film 5 cannot be secured because the resist pattern 6 can be disposed on the sidewall 5a when alignment shift is caused between the first semiconductor mask 1 and the second semiconductor mask 2. The alignment shift between the first semiconductor mask 1 and the second semiconductor mask 2 is generally approximately 0.3 μm. Therefore, the flatness of the insulating film 5 is not affected even when the alignment shift is caused between the first semiconductor mask 1 and the second semiconductor mask 2 as far as the masking area interval d is substantially equal to the width d. of the sidewall 5a.

In the masking device according to the above-described embodiment, both the first semiconductor mask and the second semiconductor mask are positive type masks. When at least one of the first and second semiconductor masks is a negative type mask, the masking area of the negative type mask is substituted with an exposed area in the above description. When one of the first and second semiconductor masks is a positive type mask and the other is a negative type mask, distances between the outlines of the masking areas of one semiconductor mask and the outlines of the exposed areas of the other semiconductor mask are set at a predetermined uniform dimension. When both the first and second semiconductor masks are negative type masks, distances between the outlines of the exposed areas of one semiconductor mask and the outlines of the exposed areas of the other semiconductor mask are set at a predetermined uniform dimension.

Now, a first method of manufacturing the semiconductor masking device according to the embodiment of the invention will be described referring to FIGS. 2(a), 2(b), 3(a) and 3(b).

Figure 2A:
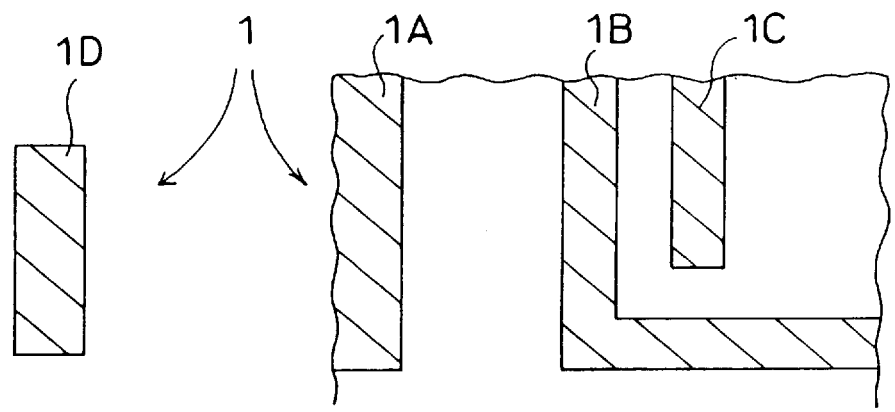
FIGS. 2(a) and 2(b) are plan views for showing a first method of manufacturing the semiconductor masking device of the embodiment.

FIG. 2(a) shows the plane structures of the masking areas 1A, 1B, 1C and 1D of the first semiconductor mask 1. The masking areas 1A, 1B and 1C are identical to those shown in FIG. 1(a), and the masking area 1D is not shown in FIG. 1(a) but newly shown in FIG. 2(a).

Figure 2B:
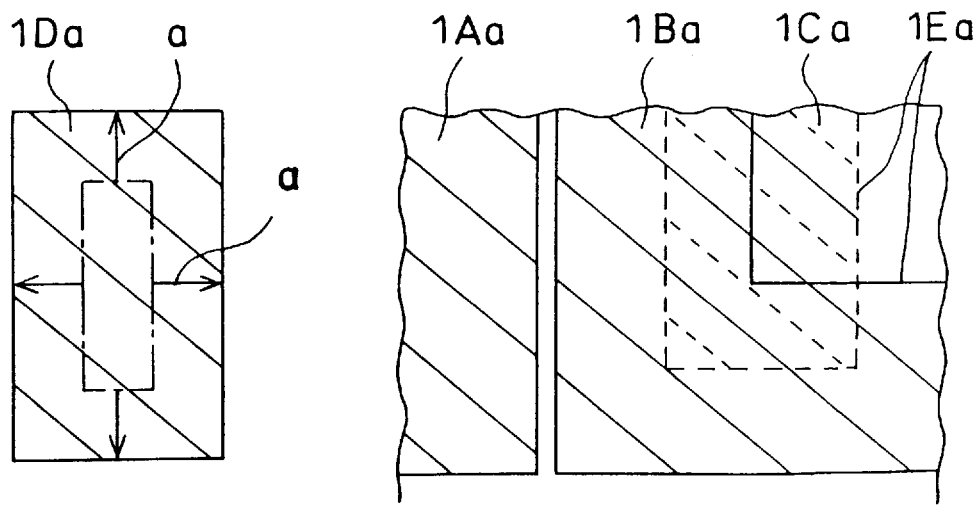

First, the masking areas 1A, 1B, 1C and 1D of the first semiconductor mask 1 are arithmetically processed, so as to enlarge each of the masking areas by an enlarging dimension a in the x direction and the y direction, respectively as is shown with arrows in FIG. 2(b). Thus, first intermediate masking areas 1Aa, 1Ba, 1Ca and 1Da are formed. The first intermediate masking area 1Ca is shown with broken lines in FIG. 2(b) for the sake of convenience. In this case, the distance between the masking area 1B and the masking area 1C is smaller than the double of the enlarging dimension a, and hence, the first intermediate masking area 1Ba overlaps the first intermediate masking area 1Ca. An area thus graphically combined by overlapping the first intermediate masking areas is designated as a first intermediate masking area 1Ea.

Figure 3A:
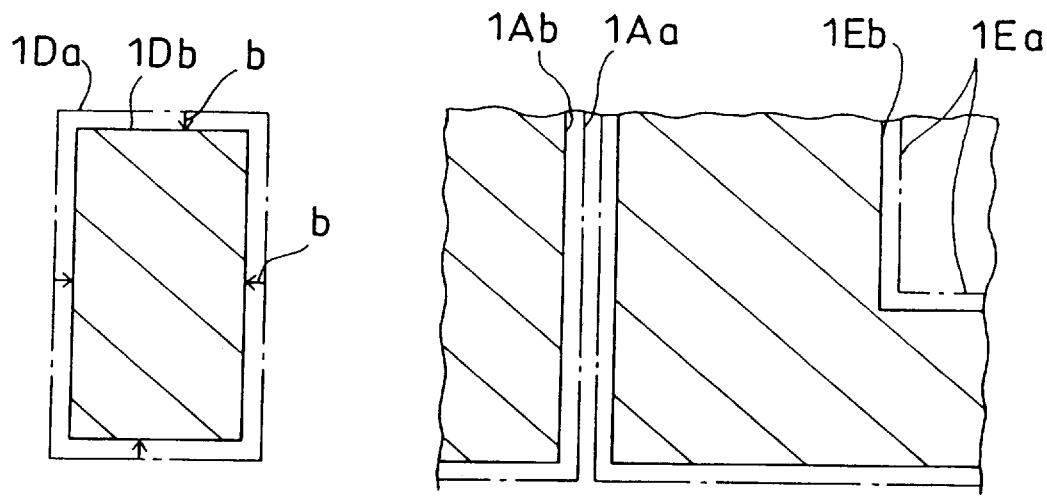
FIGS. 3(a) and 3(b) are plan views for showing the first method of manufacturing the semiconductor masking device of the embodiment.

Next, the first intermediate masking areas 1Aa, 1Ea and 1Da are arithmetically processed, so as to decrease each of the intermediate masking areas by a decreasing dimension b in the x direction and the y direction, respectively as is shown with arrows in FIG. 3(a). Thus, second intermediate masking areas 1Ab, 1Eb and 1Db are formed. At this point, the decreasing dimension b is smaller than the enlarging dimension a.

Figure 3B:
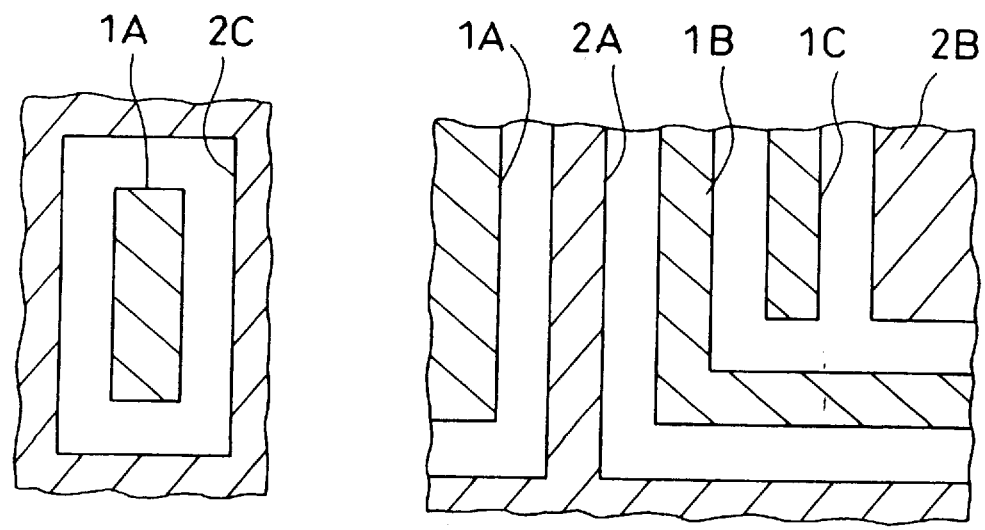

Then, as is shown in FIG. 3(b), the second intermediate masking areas 1Ab, 1Eb and 1Db are reversed, thereby forming the masking areas 2A, 2B and 2C of the second semiconductor mask 2. FIG. 3(b) also shows the masking areas 1A, 1B, 1C and 1D of the first semiconductor mask 1.

As described above, in the first manufacturing method, the masking areas 2A, 2B and 2C of the second semiconductor mask 2 can be automatically formed through the arithmetic process using a CAD apparatus and this method requires no separate mask input. It is noted that the first intermediate masking areas 1Aa, 1Ea and 1Da and the second intermediate masking areas 1Ab, 1Eb and 1Db are merely virtual areas formed during the arithmetic processes. Therefore, ultimately output patterns are only the masking areas 2A, 2B and 2C of the second semiconductor mask 2.

Now, the first manufacturing method will be specifically described by using numeric values.

It is assumed that, in FIG. 1(b), the width d, of the sidewall 5a of the insulating film 5 is 0.8 µm and that the minimum width of the masking area 2A of the second semiconductor mask 2 is 0.8 µm. On this assumption, the masking areas of the second semiconductor mask 2 cannot be formed when the width of the masking area 2B of the second semiconductor mask 2 is smaller than 0.8 µm. In other words, only when a distance between the masking areas 1A and 1B of the first semiconductor mask 1 exceeds 2.4 µm, the masking area 2A of the second semiconductor mask 2 can be present between the masking areas 1A and 1B of the first semiconductor mask 1. In the first manufacturing method, when the enlarging dimension a and the decreasing dimension b are set at 1.2 µm and 0.4 µm, respectively, the desired second semiconductor mask 2 can be manufactured.

Now, a second method of manufacturing the semiconductor masking device of the embodiment will be described referring to FIGS. 4(a), 4(b), 5(a) and 5(b).

Figure 4A:
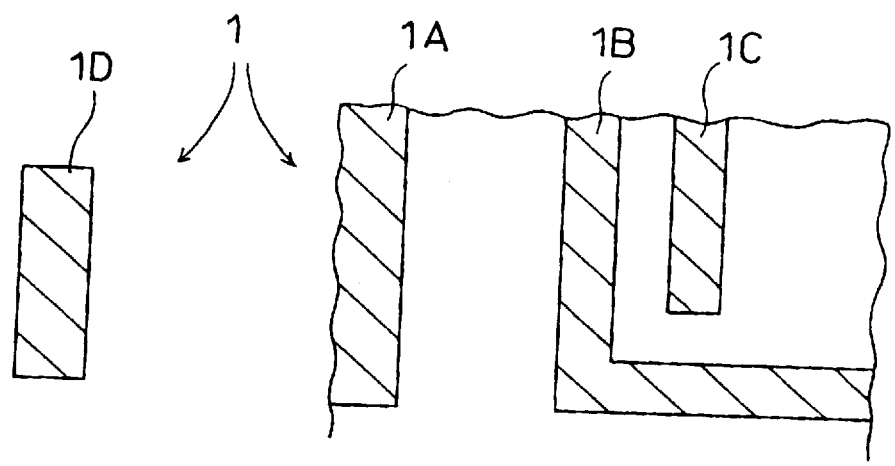
FIGS. 4(a) and 4(b) are plan views for showing a second method of manufacturing the semiconductor masking device of the embodiment.

FIG. 4(a) shows the plane structures of the masking areas 1A, 1B, 1C and 1D of the first semiconductor mask 1. The masking areas 1A, 1B and 1C are identical to those shown in FIG. 1(a), and the masking area 1D is not shown in FIG. 1(a) but newly shown in FIG. 4(a).

Figure 4B:
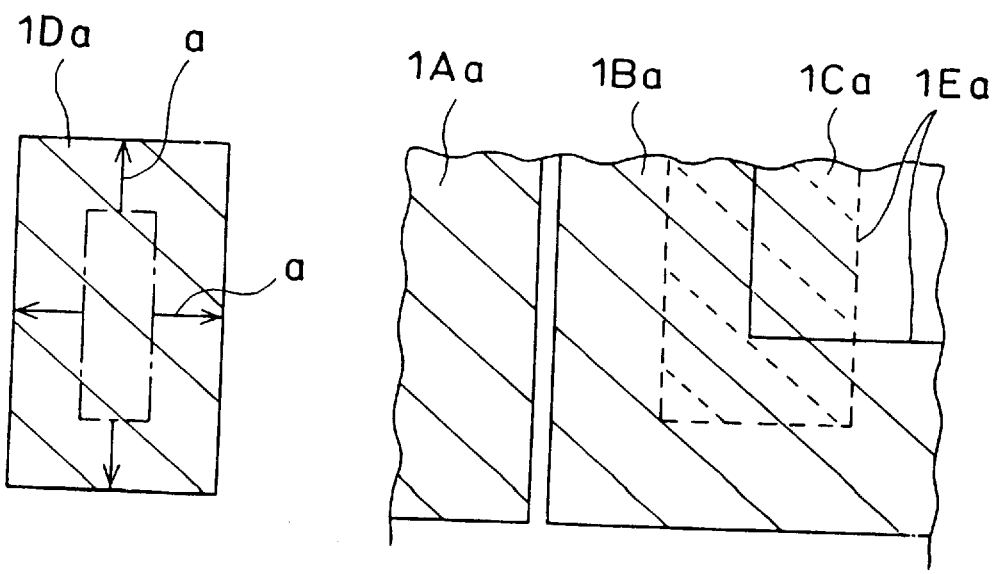

First, the masking areas 1A, 1B, 1C and 1D of the first semiconductor mask 1 are arithmetically processed, so as to enlarge each of the masking areas by an enlarging dimension a in the x direction and the y direction, respectively as is shown with arrows in FIG. 4(b). Thus, first intermediate masking areas 1Aa, 1Ba, 1Ca and 1Da are formed. The first intermediate masking area 1Ca is shown with broken lines in FIG. 4(b) for the sake of convenience. In this case, a distance between the masking area 1B and the masking area 1C is larger than the double of the enlarging dimension a, and hence, the first intermediate masking area 1Ba overlaps the first intermediate masking area 1Ca. An area thus graphically combined by overlapping the first intermediate masking areas is designated as a first intermediate masking area 1Ea.

Figure 5A:
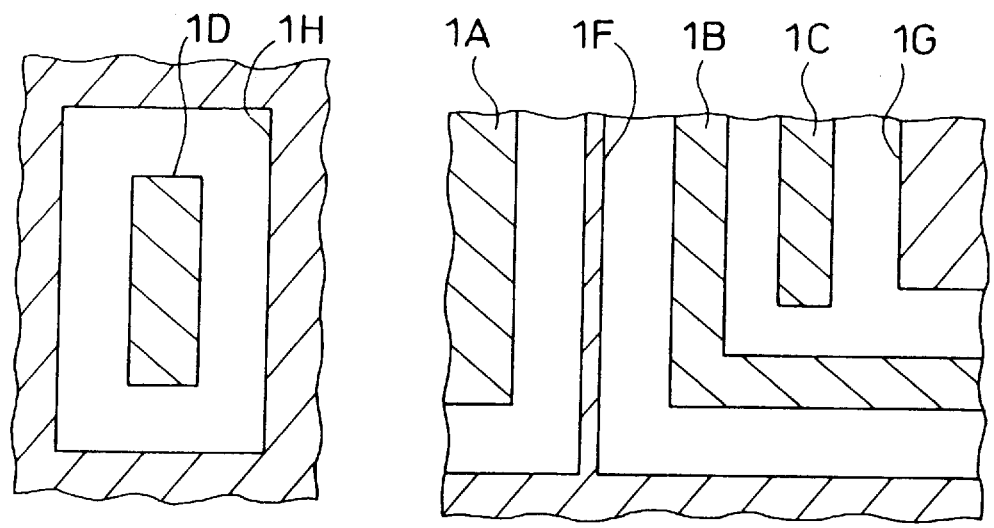
FIGS. 5(a) and 5(b) are plan views for showing the second method of manufacturing the semiconductor masking device of the embodiment.

Next, as is shown in FIG. 5(a), the first intermediate masking areas 1Aa, 1Ea and 1Da are graphically reversed, thereby forming second intermediate masking areas 1F, 1G and 1H.

Figure 5B:
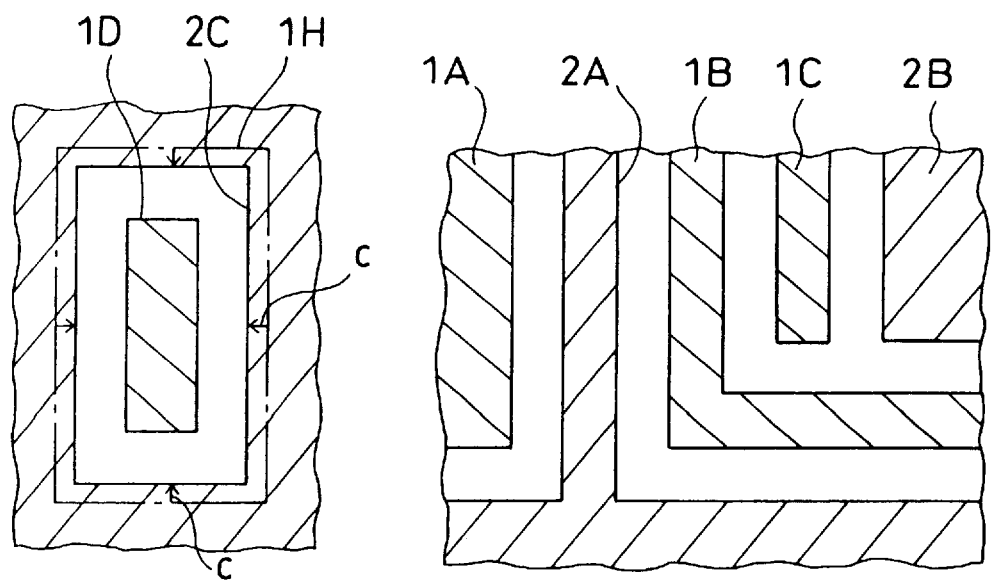

Then, the second intermediate masking areas 1F, 1G and 1H are enlarged by an enlarging dimension c in the x direction and the y direction, respectively as is shown with arrows in FIG. 5(b). Thus, the masking areas 2A, 2B and 2C of the second semiconductor mask 2 are formed. At this point, the enlarging dimension c is smaller than the enlarging dimension a. FIGS. 5(a) and 5(b) also show the masking areas 1A, 1B, 1C and 1D of the first semiconductor mask 1.

As described above, in the second manufacturing method, the masking areas 2A, 2B and 2C of the second semiconductor mask 2 can be automatically formed through the arithmetic processes using the CAD apparatus and this method requires no separate mask input similarly to the first manufacturing method. It is noted that the first intermediate masking areas 1Aa, 1Ea and 1Da and the second intermediate masking areas 1F, 1G and 1H formed in the second manufacturing method are merely virtual areas formed during the processes. Therefore, ultimately output patterns are only the masking areas 2A, 2B and 2C of the second semiconductor mask 2.

Now, the second manufacturing method will be specifically described by using numeric values.

It is assumed that, in FIG. 1(b), the width $d_1$ of the sidewall 5a of the insulating film 5 is 0.8 µm and that the minimum width of the masking area 2A of the second semiconductor mask 2 is 0.8 µm. On this assumption, when the width of the masking area 2B of the second semiconductor mask 2 is smaller than 0.8 µm, the masking area of the second semiconductor mask 2 cannot be formed. In other words, only when a distance between the masking areas 1A and 1B of the first semiconductor mask 1 exceeds 2.4 μm, the masking areas 2A of the second semiconductor mask 2 can be present between the masking areas 1A and 1B of the first semiconductor mask 1. In the second manufacturing method, when the enlarging dimension a and the enlarging dimension c are set at 1.2 μm and 0.4 μm, respectively, the desired second semiconductor mask 2 can be manufactured.

Now, a third method of manufacturing the semiconductor masking device of the embodiment will be described referring to FIGS. 6(a), 6(b), 7(a) and 7(b).

Figure 6A:
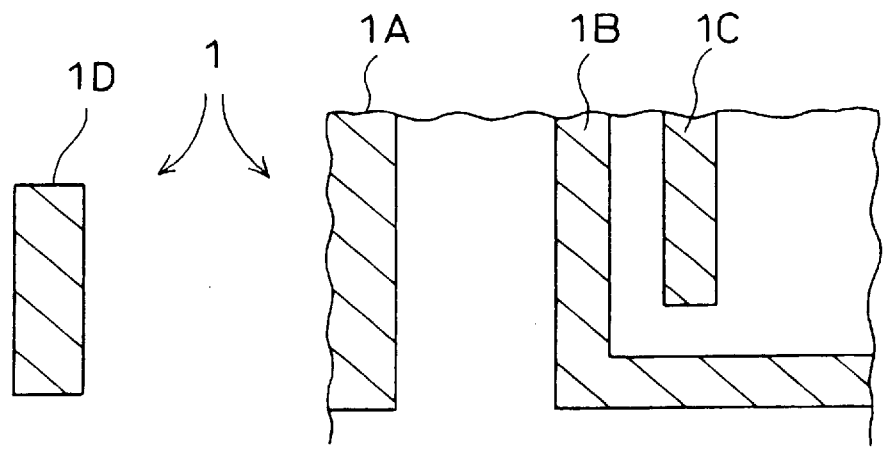
FIGS. 6(a) and 6(b) are plan views for showing a third method of manufacturing the semiconductor masking device of the embodiment.

FIG. 6(a) shows the plane structures of the masking areas 1A, 1B, 1C and 1D of the first semiconductor mask 1. The masking areas 1A, 1B and 1C are identical to those shown in FIG. 1(a), and the masking area 1D is not shown in FIG. 1(a) but newly shown in FIG. 6(a).

Figure 6B:
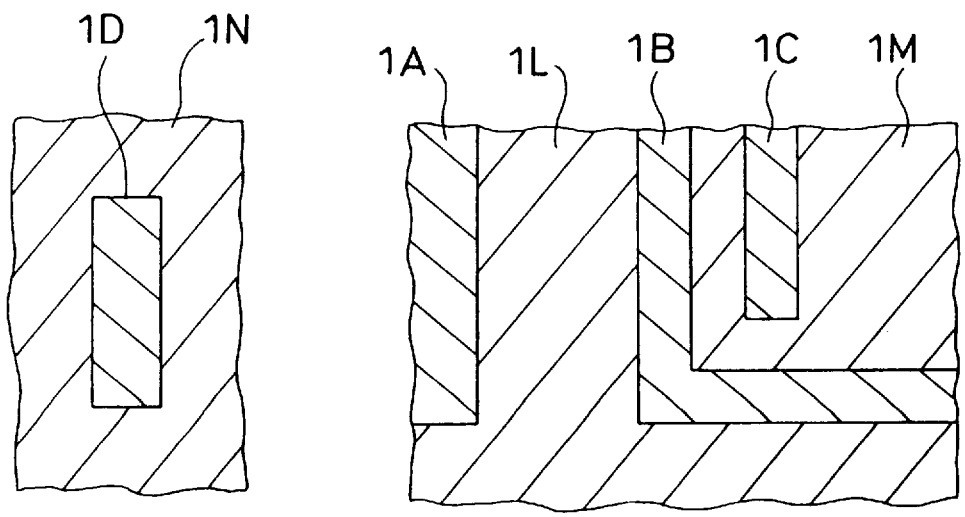

First, as is shown in FIG. 6(b), the masking areas 1A, 1B, 1C and 1D of the first semiconductor mask 1 are reversed, thereby forming first intermediate masking areas 1L, 1M, 1N.

Figure 7A:
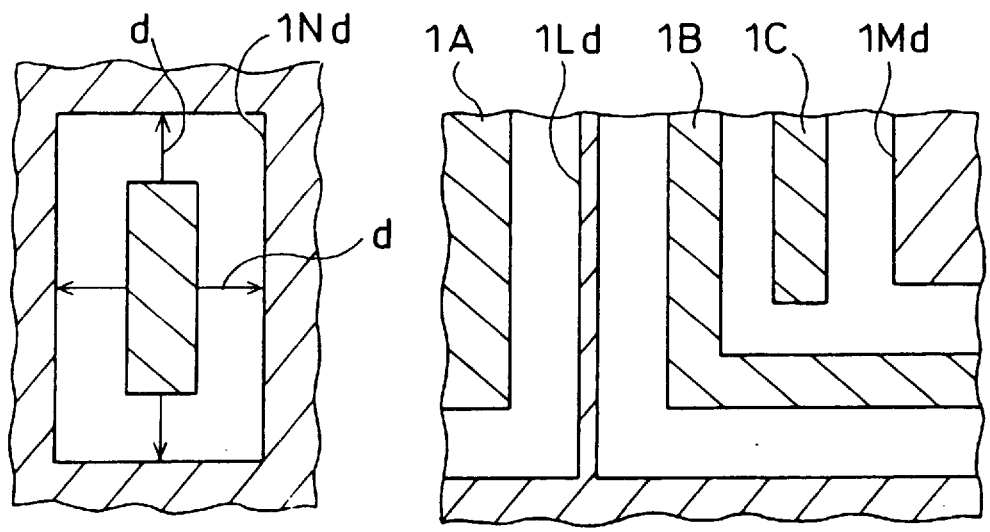
FIGS. 7(a) and 7(b) are plan views for showing the third method of manufacturing the semiconductor masking device of the embodiment.

Next, the first intermediate masking areas 1L, 1M and 1N are arithmetically processed, so as to decrease each of the masking areas by a decreasing dimension d in the x direction and the y direction, respectively as is shown with arrows in FIG. 7(a). Thus, second intermediate masking areas 1Ld, 1Md and 1Nd are formed. In this case, a distance between the masking areas 1B and 1C is smaller than the double of the decreasing dimension d, and hence, no second intermediate masking area is present between the masking areas 1B and 1C.

Figure 7B:
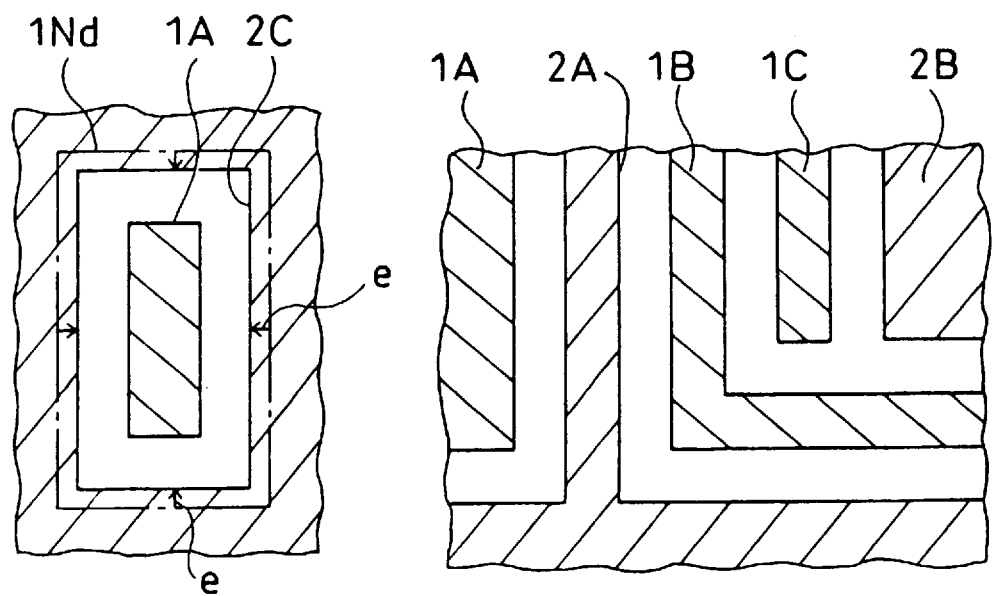

Then, as is shown in FIG. 7(b), each of the second intermediate masking areas 1Ld, 1Md and 1Nd is increased by an increasing dimension e in the x direction and the y direction, respectively, thereby forming the masking areas 2A, 2B and 2C of the second semiconductor mask 2. At this point, the increasing dimension e is smaller than the decreasing dimension d. FIGS. 7(a) and 7(b) also show the masking areas 1A, 1B, 1C and 1D of the first semiconductor mask 1.

As described above, in the third manufacturing method, the masking areas 2A, 2B and 2C of the second semiconductor mask 2 can be automatically formed through the arithmetic processes using the CAD apparatus and this method requires no separate mask input similarly to the first manufacturing method. It is noted that the first intermediate masking areas 1L, 1M and 1N and the second intermediate masking areas 1Ld, 1Md and 1Nd formed in the third manufacturing method are merely virtual areas formed during the processes. Therefore, ultimately output patterns are only the masking areas 2A, 2B and 2C of the second semiconductor mask 2.

Now, the third manufacturing method will be specifically described by using numeric values.

It is assumed that, in FIG. 1(b), the width di of the sidewall 5a of the insulating film 5 is 0.8 μm and that the minimum width of the masking area 2B of the second semiconductor mask 2 is 0.8 μm. In the third manufacturing method, when the decreasing dimension d and the decreasing dimension e are set at 1.2 μm and 0.4 μm, respectively, the desired second semiconductor mask 2 can be manufactured.

In the first through third manufacturing methods, it goes without saying that the enlarging dimension a, the decreasing dimension b, the enlarging dimension c, the decreasing dimension d and the increasing dimension e are determined on the basis of the width of the sidewall 5a of the insulating film 5 and the minimum width of the masking area of the second semiconductor mask, and can be set at appropriate values depending upon the adopted manufacturing process for a semiconductor device to be manufactured by using the masking device.

Now, a first method of manufacturing a semiconductor device in which an insulating film can be completely flattened by using the semiconductor masking device according to the embodiment of the invention will be described referring to FIGS. 8(a) through 8(d) and 9(a) through 9(c).

Figure 8A:
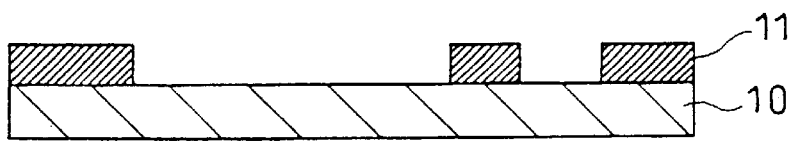
FIGS. 8(a) through 8(d) are sectional views for showing processes in a first method of manufacturing a semiconductor device using the semiconductor masking device of the embodiment.

First, as is shown in FIG. 8(a), after a metal film is deposited on the entire top surface of a semiconductor substrate 10 bearing transistors and the like formed by a known method, the metal film is etched by using the first semiconductor mask 1 for forming an interconnection area, thereby forming an interconnection 11. The height of the interconnection 11 is assumed to be 0.6 μm.

Figure 8B:
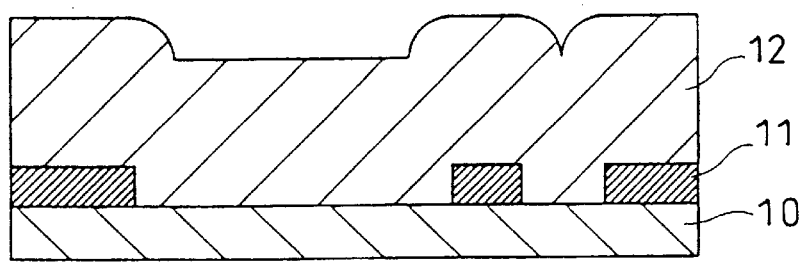
Figure 8C:
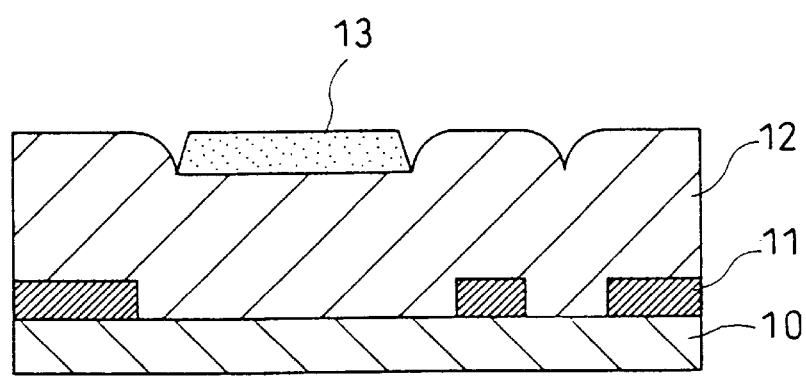
Figure 8D:
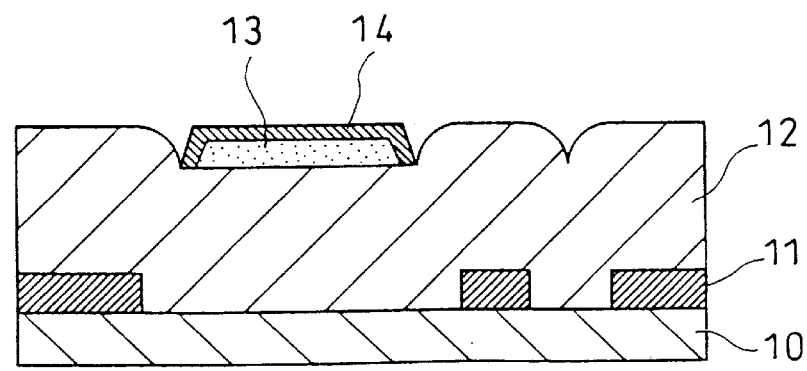

Next, as is shown in FIG. 8(b), an interlayer insulating film 12 of, for example, a silicon oxide film is deposited on the entire surface by a thickness of 2.0 μm. Then, after a first resist film is deposited on the entire top surface of the interlayer insulating film 12, the first resist film is made into a resist pattern 13 for flattening by using the second semiconductor mask 2 for forming a resist pattern. The height of the resist pattern 13 is assumed to be 0.6 μm similarly to that of the interconnection 11.

When the thickness of the interlayer insulating film 12 is 2.0 μm, the width of the sidewall of the interlayer insulating film 12 formed due to the level difference caused by the interconnection 11 is 0.8 μm. Accordingly, the second semiconductor mask 2 with the minimum distance between the masking areas of 0.8 μm, which is manufactured by any of the first through third manufacturing methods, can be directly used. Therefore, the masking area of the second semiconductor mask 2, and ultimately the resist pattern 13, is not present in an interconnection pattern area where the distance between the adjacent interconnections 11 is smaller than 2.4 μm.

Next, the resist pattern 13 is post-baked in order to remove a solvent included in the resist pattern 13. At this point, the baking temperature for the resist pattern is 150° C. or more and the resist pattern is simultaneously irradiated with UV. The baking time is 50 seconds or more after the baking temperature becomes 150° C. Through the UV irradiation, a cured layer 14 is formed on the surface of the resist pattern 13.

Figure 9A:
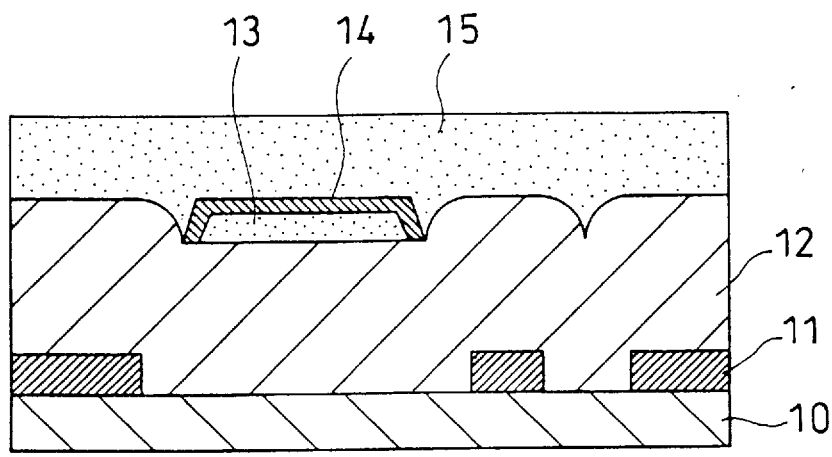
FIGS. 9(a) through 9(c) are sectional views for showing processes in the first method of manufacturing a semiconductor device using the semiconductor masking device of the embodiment.

Then, in order to fill minor recesses which have not been filled with the resist pattern 13, a second resist film 15 is uniformly coated in a thickness of 1.5 μm as is shown in FIG. 9(a). Since the cured layer 14 is formed on the surface of the resist pattern 13, the second resist film 15 is prevented from being mixed with the resist pattern 13 owing to a solvent included in the second resist film 15. In the case where the baking temperature for the resist pattern 13 is lower than 150° C. or the resist pattern 13 is not irradiated with UV, the second resist film 15 is mixed with the resist pattern 13. This results in a failure to improve the surface flatness.

Figure 9B:
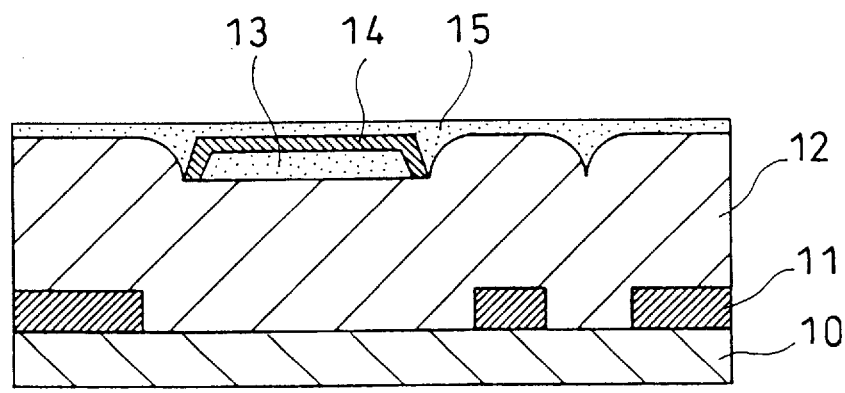

Next, as is shown in FIG. 9(b), only the second resist film 15 is etched by oxygen plasma.

Generally, an end point detector is used to detect the etching end point, and the etching is stopped when the surface of the interlayer insulating film 12 is exposed.

However, in the case of the multilayer interconnection, the level differences are caused not only by the interconnection 11 but also by the transistors formed on the substrate. Therefore, in the entire semiconductor device, there can exist a level difference larger than 0.6 μm, namely, larger than the level difference caused by the interconnection 11. In such a case, the pattern in the multilayer interconnection becomes difficult to be refined due to a lack of the depth of focus. Furthermore, when the end point detector is used, luminescence caused by the silicon oxide film serving as the interlayer insulating film 12 is detected.

Therefore, the second resist film 15 is required to be over-etched, which makes the surface of the second resist film 15 irregular. In order to form a refined pattern in which the line width of the interconnection 11 is 0.6 μm or less as described above, it is necessary to eliminate even minor irregularity. Accordingly, in the etching of the second resist film 15, a time etching method in which the etching time is calculated based on the etching rate and the thickness to be etched is adopted, and the etching is stopped before the interlayer insulating film 12 is exposed. For example, when the dispersion in the thickness of the second resist film 15 is 10% maximum, the etching is stopped when the second resist film 15 is etched by 1.35 μm, that is, 10% as small as the target coating thickness of the second resist film 15 of 1.5 μm.

Figure 9C:
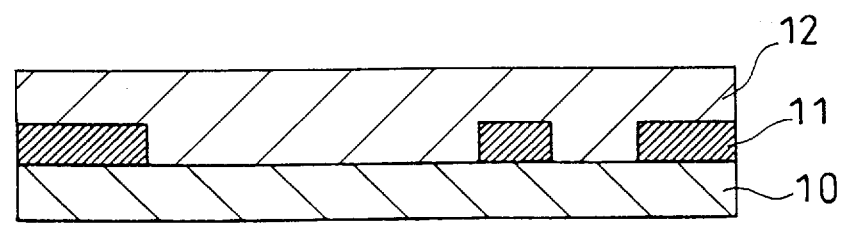

Next, as is shown in FIG. 9(c), the remaining second resist film 15, the resist pattern 13 and the interlayer insulating film 12 are etched until the interlayer insulating film 12 achieves a desired thickness.

Figure 12:
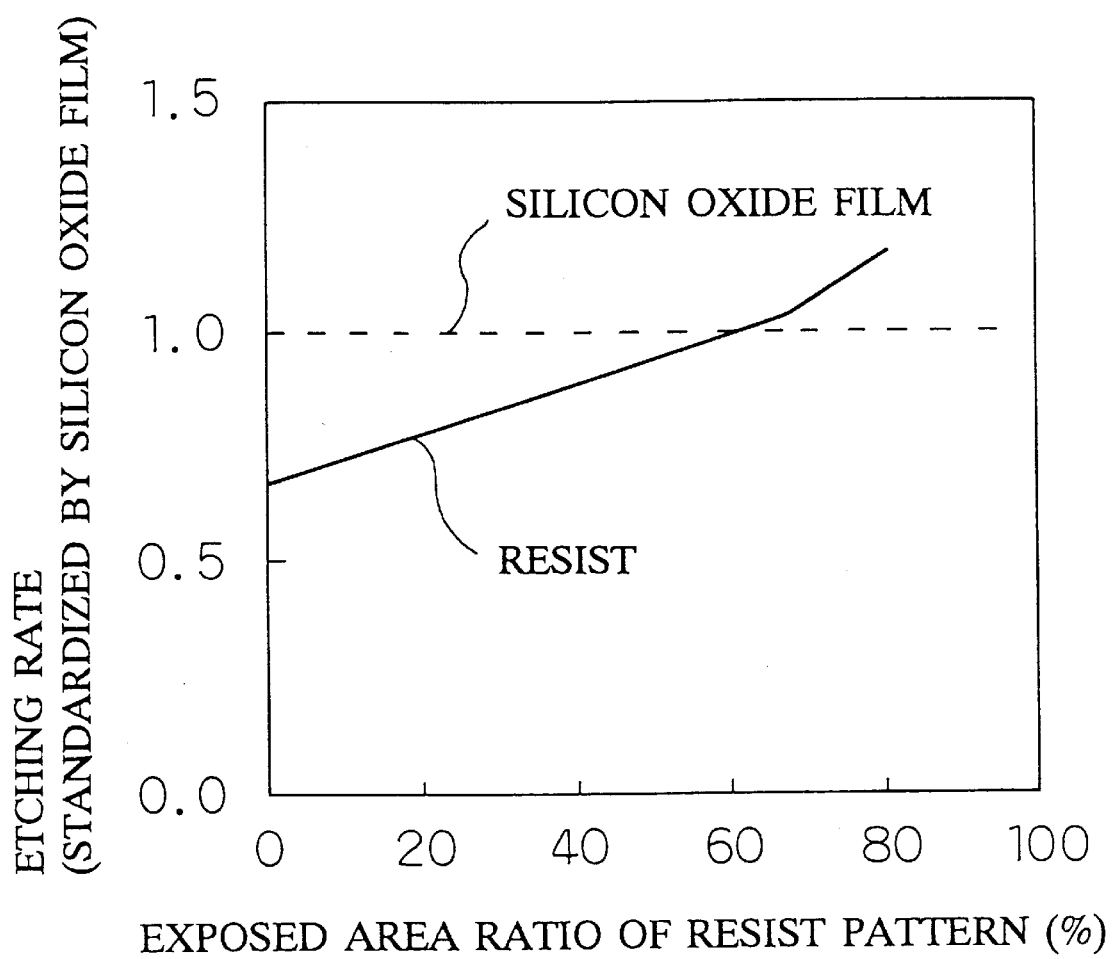
FIG. 12 is a characteristic diagram for showing dependency of the etching rate for a resist pattern on the exposed area ratio of the resist pattern.
Figure 13A:
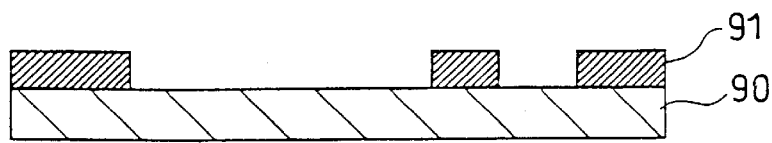
FIGS. 13(a) through 13(e) are sectional views for showing processes in a method of manufacturing a semiconductor device using a conventional semiconductor masking device.
Figure 13B:
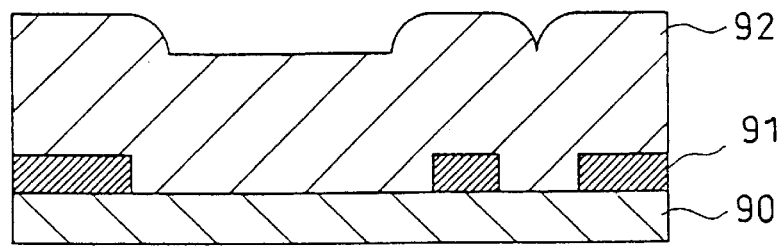
Figure 13C:
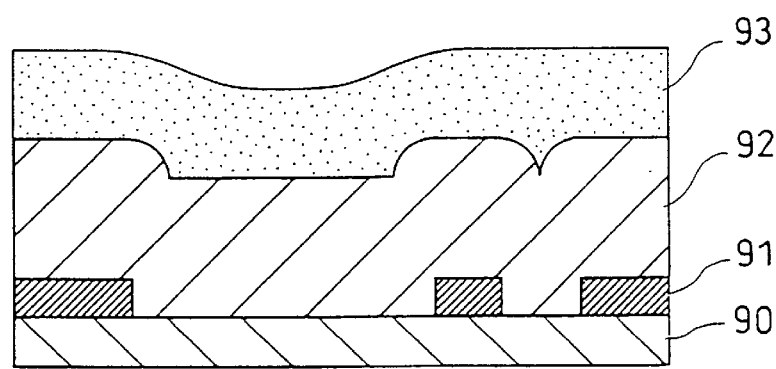
Figure 13D:
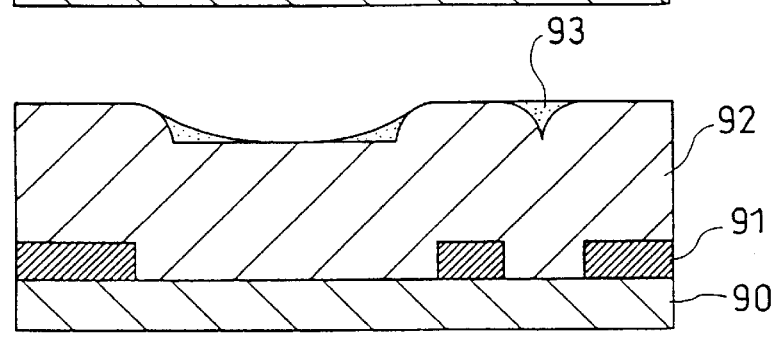
Figure 13E:
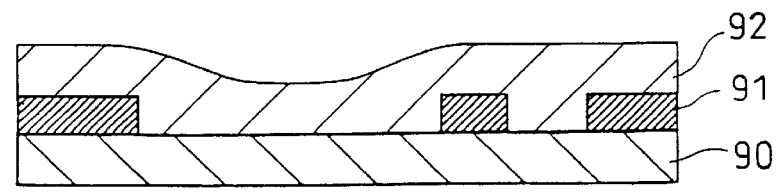

The etching rate of a resist largely depends upon the exposed area ratio of the resist. FIG. 12 shows an actual example of the dependency of the etching rate of a resist material on the exposed area ratio thereof when the etching rate of a silicon oxide film is assumed to be one. As is obvious from FIG. 12, as the exposed area ratio of the resist is increased and the area of the resist pattern is decreased, the etching rate is increased. In contrast, the dependency on the exposed area ratio cannot be found in the silicon oxide film.

When the semiconductor masking device according to the embodiment of the invention is used, the exposed area ratio of the resist pattern can be obtained on the basis of the exposed area ratio of the second semiconductor mask 2. Therefore, the mixing ratio of an etching gas to be used can be adjusted so that the etching rate for the resist pattern 13 formed by using the second semiconductor mask 2 is equal to the etching rate for the silicon oxide film. In this manner, the flatness of the surface obtained in the process shown in FIG. 9(a) can be reflected in the surface of the insulating film 12, resulting in forming the insulating film 12 having a flat surface without irregularity.

In the first method of manufacturing a semiconductor device, a silicon oxide film is used as the interlayer insulating film 12, but the interlayer insulating film 12 is not limited to the silicon oxide film but can be any film as far as the film can insulate an interconnection in a lower layer from an interconnection in an upper layer. Furthermore, even when the interlayer insulating film is made of a film other than the silicon oxide film, the interlayer insulating film can achieve a flat surface without irregularity as far as the ratio between the etching rate for the interlayer insulating film and that for the resist is adjusted to be equal to each other as in the first manufacturing method.

Now, a second method of manufacturing a semiconductor device in which an insulating film can be completely flattened by using the semiconductor masking device according to the embodiment will be described referring to FIGS. 10(a) through 10(d) and 11(a) through 11(d).

Figure 10A:
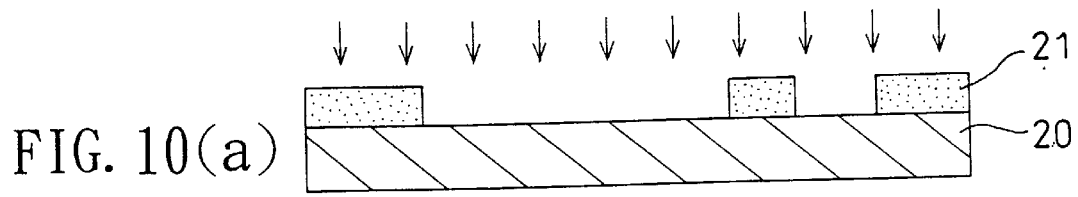
FIGS. 10(a) through 10(d) are sectional views for showing processes in a second method of manufacturing a semiconductor device using the semiconductor masking device of the embodiment.
Figure 10B:
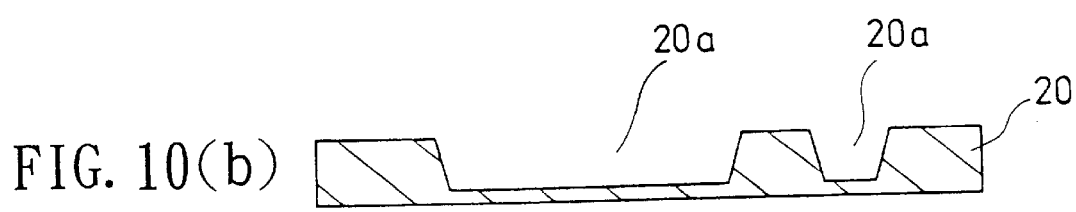

First, as is shown in FIG. 10(a), after a first resist film is deposited on the entire top surface of a semiconductor substrate 20 bearing transistors and the like, the first resist film is made into a first resist pattern 21 by using the first semiconductor mask 1. Then, the semiconductor substrate 20 is etched by using the first resist pattern 21 as a mask, thereby forming recesses 20a each with a depth of 0.6 μm serving as an isolation on the semiconductor substrate 20 as is shown in FIG. 10(b).

Figure 10C:
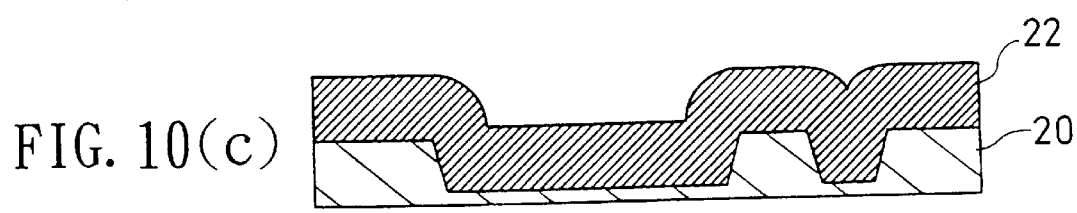
Figure 10D:
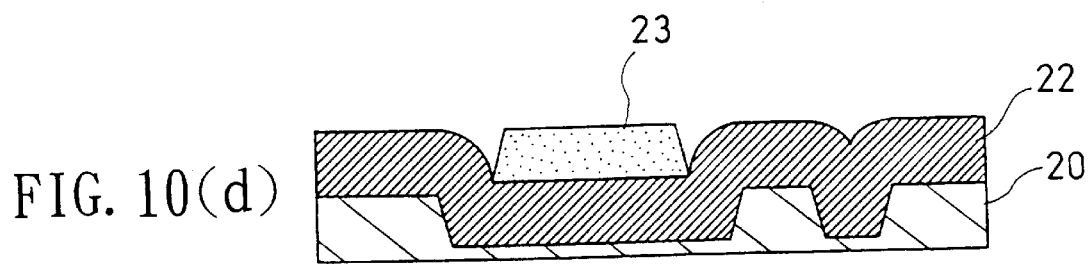

Next, as is shown in FIG. 10(c), an insulating film 22 of a silicon oxide film is formed on the entire top surface of the semiconductor substrate 20 in a thickness of 0.7 μm. In this case, the insulating film 22 can be formed in a smaller thickness than that in the first method of manufacturing a semiconductor device because the insulating film 22 on areas other than the recesses 20a is removed differently from the interlayer insulating film used in the first method.

Then, after a second resist film is deposited on the entire surface of the insulating film 22, the second resist film is made into a second resist pattern 23 by using the second semiconductor mask 2. The thickness of the second resist pattern 23 is equal to the depth of the recess 20a of the semiconductor substrate 20, namely, 0.6 μm. In this case, when the thickness of the insulating film 22 is 0.7 μm, the width of the sidewall of the insulating film 22 formed by a level difference caused by the recess 20a is 0.4 μm. Accordingly, the second semiconductor mask 2 with the minimum distance between the masking areas of 0.8 μm, which is manufactured by any of the first through third methods of manufacturing the semiconductor masking device, can be directly used. Therefore, in an area of the recess 20a where the width is smaller than 1.6 μm, the masking area of the second semiconductor mask 2, and ultimately the second resist pattern 23, is not present.

Figure 11A:
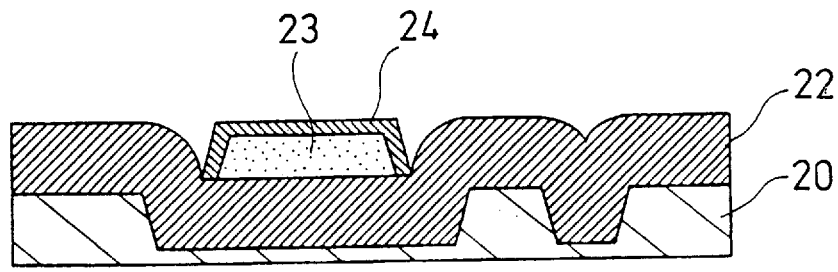
FIGS. 11(a) through 11(d) are sectional views for showing processes in the second method of manufacturing a semiconductor device using the semiconductor masking device of the embodiment.

Then, the second resist pattern 23 is post-baked in order to remove a solvent included in the second resist pattern 23. The baking temperature for the resist pattern is 150° C. or more, and the resist pattern is simultaneously irradiated with UV. The baking time is 50 seconds or more after the baking temperature becomes 150° C. Through the UV irradiation, a cured layer 24 is formed on the surface of the second resist pattern 23 as is shown in FIG. 11(a).

Figure 11B:
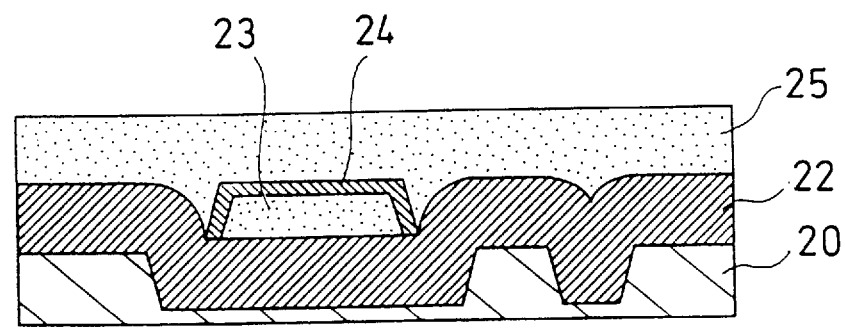

Next, in order to fill minor recesses which have not been filled with the second resist pattern 23, a third resist film 25 is uniformly coated in a thickness of 1.2 μm as is shown in FIG. 11(b). Since the cured layer 24 is formed on the surface of the second resist pattern 23, the third resist film 25 is prevented from being mixed with the second resist pattern 23 due to a solvent included in the third resist film 25. In the case where the baking temperature for the second resist pattern 23 is lower than 150° C. or the second resist pattern 23 is not irradiated with UV, the third resist film 25 is mixed with the second resist pattern 23, resulting in a failure in improving the surface flatness.

Figure 11C:
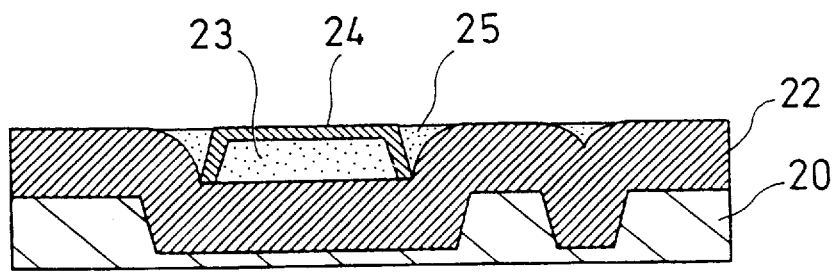
Figure 11D:
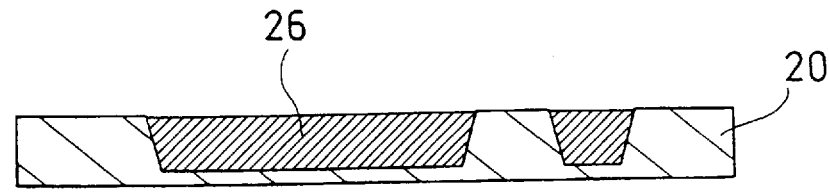

Then, as is shown in FIG. 11(c), only the third resist film 25 is etched by the oxygen plasma. Differently from the first method of manufacturing a semiconductor device, there is no level difference except for those caused by the recesses 20a of the semiconductor substrate 20, and hence, the etching end point can be detected by using an end point detector and the etching can be stopped when the surface of the insulating film 22 is exposed. However, the time etching method can be adopted similarly to the first manufacturing method in order to achieve further better flatness.

Next, in order to remove the remaining third resist film 25 and the insulating film 22, the remaining third resist film 25 and the insulating film 22 are etched until the surface of the semiconductor substrate 20 is exposed. Similarly to the first manufacturing method for a semiconductor device, since the exposed area ratio of the resist pattern can be obtained on the basis of the exposed area ratio of the second semiconductor mask 2, the mixing ratio of an etching gas to be used can be adjusted so that the etching rate for the second resist pattern 23 formed by using the second semiconductor mask 2 is equal to the etching rate for the silicon oxide film. In this manner, the surface obtained in the process shown in FIG. 11(b) can be reflected in the surface of an isolation area 26, resulting in forming the isolation area 26 having a flat surface without irregularity.

In the second method of manufacturing a semiconductor device, a silicon oxide film is used as the insulating film 22, but the insulating film 22 is not limited to the silicon oxide film but can be any film as far as the film has a function as an isolation area. Furthermore, even when the insulating film is made of a film other than the silicon oxide film, the insulating film can achieve a flat surface without irregularity as far as the ratio between the etching rate for the insulating film and that for the second resist is adjusted to be equal to each other as in the second manufacturing method.

In this manner, when the semiconductor masking device according to the embodiment of the invention is used, a semiconductor device including an insulating film having a completely flat surface without irregularity can be manufactured not only in a multilayer interconnection process but also in an isolation process.

Additionally, according to the first and second methods of manufacturing a semiconductor device, a semiconductor device can be manufactured at a low cost without introducing new equipment by merely adding a lithography process to the conventional processes.

Furthermore, since the dry etching which can be easily control is used for the etch back, a semiconductor device having high reliability and including refined elements can be manufactured at a high yield.

What is claimed is:

1. A set of photo masks for a semiconductor device comprising:
    a first photo mask having first masking areas which are used to form a first resist pattern on a semi-conductor substrate, said first resist pattern serving as an etching mask for forming an etching pattern having a first recess; and
    a second photo mask having second masking areas which are used to form a second resist pattern on a second recess that occurs by the presence of the first recess of the etching pattern when an insulating film is formed on the etching pattern on the semiconductor substrate, the second recess being provided in the insulating film,
    wherein distances between outlines of the first masking areas and outlines of the second masking areas are set at a predetermined uniform dimension so as to allow the second resist pattern to be formed such that the edge of the second resist pattern is present at a predetermined distance from the edge of the first recess of the first etching pattern formed with the use of the first resist pattern as an etching mask.

2. The set of photo masks for a semiconductor device of claim 1,
    wherein the predetermined uniform dimension is larger than a width of a sidewall formed in the insulating film so as to surround each of the second recesses.

3. A method of manufacturing a set of photo masks for a semiconductor device comprising:
    a first photo mask production step of producing a first photo mask having first masking areas which are used to form a first resist pattern on a semiconductor substrate, said first resist pattern serving as an etching mask for forming an etching pattern having a first recess; and
    a second photo mask production step of producing a second photo mask having second masking areas which are used to form a second resist pattern on a second recess that occurs by the presence of the first recess of the etching pattern when an insulating film is formed on the etching pattern on the semiconductor substrate, the second recess being provided in the insulating film,
    wherein the second photo mask production step includes:
        a first step of forming first intermediate masking areas by enlarging the first masking areas of the first photo mask by a predetermined first dimension;
        a second step of forming second intermediate masking areas by decreasing the first intermediate masking areas by a predetermined second dimension; and
        a third step of reversing the second intermediate masking areas so as to produce the second photo mask having the second masking areas.

4. The method of manufacturing a set of photo masks for a semiconductor device of claim 3,
    wherein the predetermined second dimension is smaller than the predetermined first dimension.

5. A method of manufacturing a set of photo masks for a semiconductor device comprising:
    a first photo mask production step of producing a first photo mask having first masking areas which are used to form a first resist pattern on a semiconductor substrate, said first resist pattern serving as an etching mask for forming an etching pattern having a first recess; and
    a second photo mask production step of producing a second photo mask having second masking areas which are used to form a second resist pattern on a second recess that occurs by the presence of the first recess of the etching pattern when an insulating film is formed on the etching pattern on the semiconductor substrate, the second recess being provided in the insulating film,
    wherein the second photo mask production step includes:
        a first step of forming first intermediate masking areas by enlarging the first masking areas of the first photo mask by a predetermined first dimension;
        a second step of forming second intermediate masking areas by reversing the first intermediate masking areas; and
        a third step of enlarging the second intermediate masking areas by a predetermined second dimension so as to produce the second photo mask having the second masking areas.

6. The method of manufacturing a set of photo masks for a semiconductor device of claim 5,
    wherein predetermined second dimension is smaller than the predetermined first dimension.

7. A method of manufacturing a set of photo masks for a semiconductor device comprising:
    a first photo mask production step of producing a first photo mask having first masking areas which are used to form a first resist pattern on a semiconductor substrate, said first resist pattern serving as an etching mask for forming an etching pattern having a first recess; and
    a second photo mask production step of producing a second photo mask having second masking areas which are used to form a second resist pattern on a second recess that occurs by the presence of the first recess of the etching pattern when an insulating film is formed on the etching pattern on the semiconductor substrate, the second recess being provided in the insulating film, wherein the second photo mask production step includes;
- a first step of forming first intermediate masking areas by reversing the first masking areas of the first photo mask;
- a second step of forming second intermediate masking areas by decreasing the first intermediate masking areas by a predetermined first dimension; and
- a third step of enlarging the second intermediate masking areas by a predetermined second dimension so as to produce the second photo mask having the second masking areas.

8. The method of manufacturing a set of photo masks for a semiconductor device of claim 7, wherein predetermined second dimension is smaller than the predetermined first dimension.

* * * * *